(12) United States Patent
Ida et al.

(10) Patent No.: US 8,390,003 B2
(45) Date of Patent: Mar. 5, 2013

(54) ELECTRONIC ELEMENT WAFER MODULE WITH REDUCED WARPING

(75) Inventors: Tohru Ida, Osaka (JP); Eiichi Hirata, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 718 days.

(21) Appl. No.: 12/455,169

(22) Filed: May 29, 2009

(65) Prior Publication Data

US 2009/0294779 A1 Dec. 3, 2009

(30) Foreign Application Priority Data

May 29, 2008 (JP) ................................. 2008-141707

(51) Int. Cl.
*H01L 27/15* (2006.01)
(52) U.S. Cl. .............................. 257/82; 257/98; 257/434
(58) Field of Classification Search .................... 257/82, 257/98, 434
See application file for complete search history.

(56) References Cited

U.S. PATENT DOCUMENTS

| | | | |
|---|---|---|---|
| 3,760,181 A * | 9/1973 | Daly et al. .................... | 250/332 |
| 7,592,200 B2 * | 9/2009 | Maeda et al. .................. | 438/75 |
| 2004/0262705 A1 | 12/2004 | Izumi et al. ................... | 257/432 |
| 2005/0087132 A1 * | 4/2005 | Dickey et al. ................. | 118/715 |
| 2005/0180010 A1 * | 8/2005 | Mukaiyama et al. ......... | 359/497 |
| 2005/0275746 A1 * | 12/2005 | Nishida et al. ................ | 348/360 |
| 2006/0051887 A1 * | 3/2006 | Yamamoto et al. ............ | 438/64 |
| 2006/0124833 A1 * | 6/2006 | Toda ........................... | 250/214 R |
| 2006/0215266 A1 * | 9/2006 | Uehara et al. ................. | 359/497 |
| 2007/0010041 A1 * | 1/2007 | Kang et al. ...................... | 438/64 |
| 2007/0202696 A1 * | 8/2007 | Inuiya ............................ | 438/666 |
| 2007/0247534 A1 * | 10/2007 | Murata et al. ................. | 348/294 |
| 2007/0275505 A1 * | 11/2007 | Wolterink et al. ............ | 438/118 |
| 2008/0001068 A1 * | 1/2008 | Farnworth et al. .......... | 250/208.1 |
| 2008/0037129 A1 * | 2/2008 | Hodgson et al. .............. | 359/588 |
| 2008/0054803 A1 * | 3/2008 | Zheng et al. .................. | 313/506 |
| 2008/0128848 A1 * | 6/2008 | Suzuki et al. ................. | 257/448 |
| 2008/0185603 A1 * | 8/2008 | Itoi et al. ......................... | 257/98 |
| 2008/0224249 A1 * | 9/2008 | Nabe et al. ..................... | 257/433 |
| 2008/0231739 A1 * | 9/2008 | Takasaki et al. .............. | 348/311 |
| 2008/0237768 A1 * | 10/2008 | Yajima et al. ................. | 257/434 |
| 2008/0239138 A1 * | 10/2008 | Sano ............................. | 348/340 |

FOREIGN PATENT DOCUMENTS

| | | |
|---|---|---|
| JP | 2003-279726 A | 10/2003 |
| JP | 2006-032886 | 2/2006 |
| JP | 2006-351615 | 12/2006 |
| JP | 2007-188909 | 7/2007 |

OTHER PUBLICATIONS

Chinese Office Action, mailed Oct. 27, 2010.

* cited by examiner

*Primary Examiner* — David Vu
*Assistant Examiner* — Caleb Henry
(74) *Attorney, Agent, or Firm* — Edwards Wildman Palmer LLP; David G. Conlin; Steven M. Jensen (57) ABSTRACT

An electronic element wafer module according to the present invention is provided, in which a translucent support substrate for covering and protecting a plurality of electronic elements is attached on an electronic element wafer having the plurality of electronic elements formed thereon, and an optical filter is formed corresponding to the electronic elements on at least one surface of the translucent support substrate, where the optical filter is removed to lessen warping along a part or all of dicing lines for individually dividing the electronic element wafer module into a plurality of electronic element modules.

31 Claims, 9 Drawing Sheets

| | coefficient of linear expansion ($10^{-6}/°C$) |
|---|---|
| Nb | 7.31 |
| Ti | 8.41 |
| Ta | 6.5 |
| Si | 2.6 |

ELECTRONIC ELEMENT WAFER MODULE WITH REDUCED WARPING

This nonprovisional application claims priority under 35 U.S.C. §119(a) to Patent Application No. 2008-141707 filed in Japan on May 29, 2008, the entire contents of which are hereby incorporated by reference.

BACKGROUND OF THE INVENTION

1. Field of the Invention

The present invention relates to an electronic element wafer module in which an optical filter layer is provided on a cover glass which protects a plurality of electronic elements; a method for manufacturing the electronic element wafer module; an electronic element module formed by cutting the electronic element wafer module into pieces; an electronic element module in which an optical element is further attached thereon; and an electronic information device, such as a digital camera (e.g., a digital video camera and a digital still camera), an image input camera, a scanner, a facsimile machine, and a camera-equipped cell phone device, having any of the electronic element modules as an image input device used in an image capturing section thereof.

2. Description of the Related Art

Digital cameras and video cameras using a sensor module, functioning as a electronic element module, as an image input device in an image capturing section thereof have conventionally come into wide use.

Currently, commonly used sensor modules are formed, for example, of a solid-state image capturing element chip in which the solid-state image capturing element is provided on a silicon semiconductor substrate; a ceramic package for housing the solid-state image capturing element chip; and a transparent cover glass for encapsulating the package. The solid-state image capturing element chip housed in the package is connected to circuits on a printed circuit board by electrically connecting an electrode pad provided on the solid-state image capturing element chip with a connection terminal of the package by wire bonding, and by installing an external connection terminal of the package on the printed circuit board.

It is also practiced to install a solid-state image capturing element as an electronic element into a small electronic information device, such as a cell phone device and an electronic notebook to add a photographing function. In order to facilitate the installation of the photographing function into the small electronic information device, an optical unit, which includes a solid-state image capturing element and an image-capturing optical system installed therein, and a printed circuit board provided with a control circuit thereon are assembled in advance and they are unitized, so that a camera module having such a configuration is provided.

Figure 10:
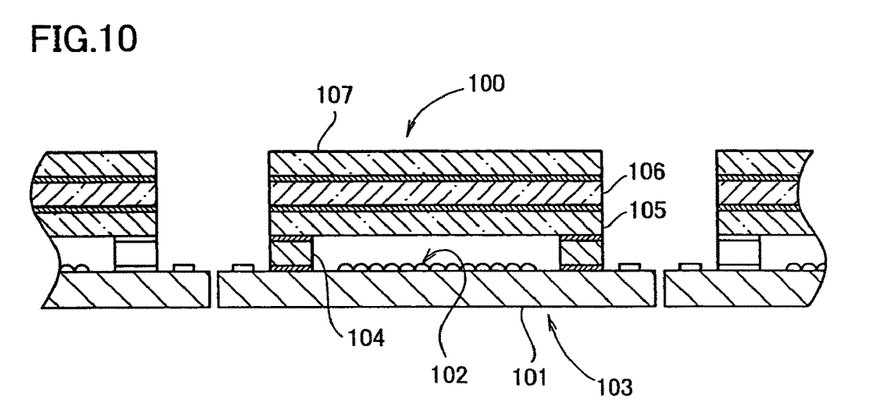
FIG. 10 is an essential part longitudinal cross sectional view schematically illustrating one example of the conventional camera module disclosed in Reference 1.

Reference 1 discloses a conventional camera module in which an infrared ray cut filter and an optical low pass filter are installed in order to improve the picture quality. FIG. 10 illustrates such a conventional camera module.

FIG. 10 is an essential part longitudinal cross sectional view schematically illustrating one example of the conventional camera module disclosed in Reference 1.

In FIG. 10, a conventional solid-state image capturing apparatus 100 includes: a solid-state image capturing element chip 103 in which a plurality of solid-state image capturing elements 102 are provided on a semiconductor substrate 101 (semiconductor wafer); a frame section 104 for enclosing an area for forming the solid-state image capturing elements 102, the frame section 104 being provided on the solid-state image capturing element 102 side of the solid-state image capturing element chip 103; a cover glass 105 provided on the frame section 104 for functioning as a transparent support substrate that hermetically seals each of the solid-state image capturing elements 102; an infrared ray cut filter substrate 106 attached on top of the cover glass 105 to improve the picture quality; and an optical low pass filter substrate 107 attached on the infrared ray cut filter substrate 106.

The infrared ray cut filter substrate 106 and the optical low pass filter substrate 107 are positioned in such a manner to cover the solid-state image capturing elements 102. A common infrared ray cut filter includes a laminated structure of a titanium oxide film or tantalum oxide film and a silicon oxide film.

On the other hand, Reference 2 discloses a niobium oxide film ($Nb_2O_5$) as a material for an infrared ray cut filter.

Reference 1: Japanese Laid-Open Publication No. 2006-32886

Reference 2: Japanese Laid-Open Publication No. 2006-351615

SUMMARY OF THE INVENTION

When the cover glass 105, on which the infrared ray cut filter substrate 106 and the optical low pass filter substrate 107 are attached together, is attached to the semiconductor substrate 101, which is a semiconductor wafer having a plurality of solid-state image capturing elements 102 provided thereon, the conventional structure described above has a problem that the laminated structure of the cover glass 105 and the semiconductor substrate 101 warps.

The present invention is intended to solve the conventional problems described above. The objective of the present invention is to provide an electronic element wafer module that is capable of reducing the warping when a semiconductor substrate as an electronic element wafer is laminated with a cover glass that is attached with an optical filter such as an infrared ray cut filter; a method for manufacturing the electronic element wafer module; an electronic wafer module formed by making the electronic element wafer module into pieces; an electronic element module in which an optical element is further attached thereon; and an electronic information device, such as a camera-equipped cell phone device, having any of the electronic element modules as an image input device used in an image capturing section thereof.

In an electronic element wafer module according to the present invention, a translucent support substrate for covering and protecting a plurality of electronic elements is attached on an electronic element wafer having the plurality of electronic elements formed thereon, and an optical filter is formed corresponding to the electronic elements on at least one surface of the translucent support substrate, where the optical filter is removed to lessen warping along a part or all of dicing lines for individually dividing the electronic element wafer module into a plurality of electronic element modules, thereby achieving the objective described above. In this case, all of the dicing lines form a lattice form along the dicing lines. In addition, a part of the dicing lines may be a lattice form along the dicing lines (e.g., every other or every third line of the dicing lines); however, without the limitation to this, other forms may be included. In summery, in the state where a translucent support substrate is attached to an electronic element wafer, the optical filter may be removed along a part of the dicing line, which allows the warping of the attached structure (module) to be lessened.

In an electronic element wafer module according to the present invention, a translucent support substrate for covering and protecting a plurality of electronic elements is attached on an electronic element wafer having the plurality of electronic elements formed thereon, and an optical filter is formed corresponding to the electronic elements on at least one surface of the translucent support substrate, wherein the optical filter is an infrared ray cut filter comprising of a dielectric multilayered film made by alternately laminating silicon oxide films and niobium oxide films, thereby achieving the objective described above.

In an electronic element wafer module according to the present invention, a translucent support substrate for covering and protecting a plurality of electronic elements is attached on an electronic element wafer having the plurality of electronic elements formed thereon, and an optical filter is formed corresponding to the electronic elements on at least one surface of the translucent support substrate, wherein the translucent support substrate having the optical filter formed thereon and the electronic element wafer are attached together to form a laminated body in such a manner that a warping direction of the electronic element wafer and a warping direction of the translucent support substrate are in opposite directions to each other to reduce the warping of the electronic element wafer, thereby achieving the objective described above.

Preferably, in an electronic element wafer module according to the present invention, the translucent support substrate having the optical filter formed thereon and the electronic element wafer are attached together to form a laminated body in such a manner that a warping direction of the electronic element wafer and a warping direction of the translucent support substrate are in opposite directions to each other to reduce the warping of the electronic element wafer.

Still preferably, in an electronic element wafer module according to the present invention, the optical filter is an infrared ray cut filter comprising of a dielectric multilayered film that is made by alternately laminating silicon oxide films and niobium oxide films.

Still preferably, in an electronic element wafer module according to the present invention, the optical filter is removed along a part or all of dicing lines for individual divisions of a plurality of electronic element modules.

Still preferably, in an electronic element wafer module according to the present invention, an optical low pass filter is formed as the optical filter.

Still preferably, in an electronic element wafer module according to the present invention, the optical filter is formed in at least any of a plate form, a sheet form, a film form, and a layered form.

Still preferably, in an electronic element wafer module according to the present invention, the translucent support substrate is configured of glass, crystal, niobium oxide lithium, synthetic resin and/or the combination thereof.

Still preferably, in an electronic element wafer module according to the present invention, the optical filter is an infrared ray cut filter comprising of a dielectric multilayered film that is made by alternately laminating silicon oxide films and titanium oxide films.

Still preferably, in an electronic element wafer module according to the present invention, the optical filter is an infrared ray cut filter comprising of a dielectric multilayered film that is made by alternately laminating silicon oxide films and tantalum oxide films.

Still preferably, in an electronic element wafer module according to the present invention, and in the electronic element wafer, a wiring section or pad section provided on a front surface for each electronic element is electrically connected to an external connection terminal on a back surface via a through hole electrode.

A method for manufacturing an electronic element wafer module according to the present invention includes: an optical filter forming step of forming an optical filter on at least one surface of a transparent support substrate; an optical filter partially removing step of removing the optical filter along a part or all of dicing lines for individual divisions of a plurality of electronic element modules to lessen warping; and a substrate attaching step of attaching a semiconductor wafer having the plurality of electronic elements formed thereon and the transparent support substrate in which the optical filter is removed along a part or all of the dicing lines, thereby achieving the objective described above.

A method for manufacturing an electronic element wafer module according to the present invention, includes: an optical filter forming step of forming an optical filter on at least one surface of a transparent support substrate; a substrate attaching step of attaching a semiconductor wafer having a plurality of electronic elements formed thereon and the transparent support substrate having the optical filter formed thereon; and an optical filter partially removing step of removing the optical filter along a part or all of dicing lines for individual divisions of a plurality of electronic element modules to lessen warping, thereby achieving the objective described above.

A method for manufacturing an electronic element wafer module according to the present invention, includes: an optical filter forming step of forming an infrared ray cut filter comprising of a dielectric multilayered film made by alternately laminating silicon oxide films and niobium oxide films; and a substrate attaching step of attaching a translucent support substrate having the infrared ray cut filter formed thereon on an electronic element wafer having a plurality of electronic elements formed thereon, thereby achieving the objective described above.

A method for manufacturing an electronic element wafer module according to the present invention, includes: an optical filter forming step of forming an optical filter on at least one surface of a transparent support substrate; and a substrate attaching step of attaching a translucent support substrate having the optical filter formed thereon and the electronic element wafer together in such a manner that a warping direction of the electronic element wafer having a plurality of electronic elements formed thereon and a warping direction of the translucent support substrate having the optical filter formed thereon are in opposite directions to each other to reduce the warping of the electronic element wafer, thereby achieving the objective described above.

Preferably, in a method for manufacturing an electronic element wafer module according to the present invention, the substrate attaching step attaches the translucent support substrate having the optical filter formed thereon and the electronic element wafer together to form a laminated body in such a manner that a warping direction of the electronic element wafer and a warping direction of the translucent support substrate are in opposite directions to each other, to reduce the warping of the electronic element wafer.

Still preferably, in a method for manufacturing an electronic element wafer module according to the present invention, the optical filter forming step forms an infrared ray cut filter comprising of a dielectric multilayered film made by alternately laminating silicon oxide films and niobium oxide films on at least one surface of a transparent support substrate as the optical filter.

Still preferably, a method for manufacturing an electronic element wafer module according to the present invention further includes an optical filter partially removing step of removing the optical filter formed in the optical filter forming step along a part or all of dicing lines for individual divisions of a plurality of electronic element modules to lessen warping of the optical filter.

An electronic element module individually divided from the electronic element wafer module according to the present invention, by cutting of the semiconductor wafer and the translucent support substrate having the optical filter formed thereon for each of the electronic elements along a center line of dicing lines.

Preferably, an electronic element module according to the present invention includes the electronic element module according to the present invention, and an optical system positioned on an electronic element of the electronic element module, or an optical unit having the optical system embedded therein.

Still preferably, in an electronic element module according to the present invention, the electronic element is an image capturing element that includes a plurality of light receiving sections for performing photoelectric conversions and capturing an image of an image of light from a subject.

Still preferably, in an electronic element module according to the present invention, the electronic element includes a light emitting element for generating an output light and a light receiving element for receiving an incident light.

Still preferably, in an electronic element module according to the present invention, the optical system is a lens module and the electronic element is an image capturing element.

Still preferably, in an electronic element module according to the present invention, the optical system is either a prism module or a hologram element module, and the electronic element is a light emitting element and a light receiving element.

An electronic information device according to the present invention includes the electronic element module according to the present invention as a sensor module in an image capturing section thereof.

An electronic information device according to the present invention includes the electronic element module according to the present invention in an information recording and reproducing section thereof.

The functions of the present invention having the structures described above will be described hereinafter.

According to the present invention, an optical filter attached to a translucent support substrate is removed along part or all (lattice form) of dicing lines for forming a plurality of individually cut electronic element modules to reduce the warping. Furthermore, the optical filter attached to a translucent support substrate is an infrared ray cut filter, which is formed by thinning a dielectric multilayered film that is made by alternately laminating silicon oxide films and niobium oxide films. Furthermore, in order to reduce the warping of the electronic element wafer, a translucent support substrate having the optical filter formed thereon and the electronic element wafer are attached together to form a laminated body in such a manner that the warping of the electronic element wafer and the warping of the translucent support substrate are lessened by the respective warping faces being attached to each other in opposing warping directions.

As described above, the optical filter is divided into sections along a part or all of dicing lines to lessen the stress of the warping, the thickness of the optical filter is reduced in half by using a dielectric multilayered film, which is formed by alternately laminating silicon oxide films and niobium oxide films, to lessen the stress of the warping, and the translucent support substrate is attached to the semiconductor wafer having a warping direction opposite from that of the translucent support substrate to offset the respective stresses. As a result, it is possible to further reduce the warping that occurs when an electronic element wafer is laminated with a translucent support substrate having an optical filter such as an infrared ray cut filter attached thereon.

According to the present invention as described above, the optical filter is divided into sections along a part or all (lattice form) of dicing lines to lessen the stress of the warping, the thickness of the optical filter is reduced in half by using a dielectric multilayered film, which is formed by alternately laminating silicon oxide films and niobium oxide films, to lessen the stress of the warping, and the translucent support substrate is attached to the semiconductor wafer having a warping direction opposite from that of the translucent support substrate to offset the respective stresses, so that it becomes possible to further reduce the warping that occurs when an electronic element wafer is laminated to a translucent support substrate having an optical filter such as an infrared ray cut filter attached thereon.

These and other advantages of the present invention will become apparent to those skilled in the art upon reading and understanding the following detailed description with reference to the accompanying figures.

BRIEF DESCRIPTION OF THE DRAWINGS

FIG. 1(a) is an essential part longitudinal cross sectional view illustrating a case where an optical filter is not removed along a dicing line, and a semiconductor and a glass substrate with opposite warping directions are attached to each other, and FIG. 1(b) is an essential part longitudinal cross sectional view illustrating a case where an optical filter is removed along a dicing line.

FIG. 4 is a longitudinal cross sectional view illustrating the state of the warping of a semiconductor substrate and a glass substrate having an infrared ray cut filter substrate attached thereon in FIG. 1a.

1, 1A electronic element wafer module
11, 11A sensor module
2 semiconductor substrate
21 solid-state image capturing element
22 electrode pad
23 through hole
24 wiring
25 external connection terminal
3 spacer
4 cover glass (glass substrate)
5 infrared ray cut filter substrate
5a infrared ray cut filter layer
6 adhesive
7 optical low pass filter substrate
7a optical low pass filter layer
A, A' alignment mark
D dicing line
Da center line
H removing area of an optical filter layer
50 sensor module
51 through hole wafer
51a image capturing element (electronic element)
51b through hole (through hole electrode)
52 resin adhesive layer
531 glass plate
532 infrared ray cut filter substrate
533 optical low pass filter substrate
54, 541 to 543 lens plate
551, 552 lens adhesive layer
56 light shielding member
90 electronic information device
91 solid-state image capturing apparatus
92 memory section
93 display section
94 communication section
95 image output section

DESCRIPTION OF THE PREFERRED EMBODIMENTS

Hereinafter, examples of an electronic element wafer module according to the present invention, a method for manufacturing the electronic element wafer module, and a sensor module as an electronic element module formed by cutting the electronic element wafer module into pieces will be described as Embodiment 1; an example of a sensor module as an electronic element module in which an optical element is further attached thereon will be described as Embodiment 2; and an example of an electronic information device, such as a camera-equipped cell phone device, having any of the sensor modules as an image input device used in an image capturing section thereof will be described as Embodiment 3, each of which will be described in detail with reference to attached figures.

(Embodiment 1)

Figure 1:
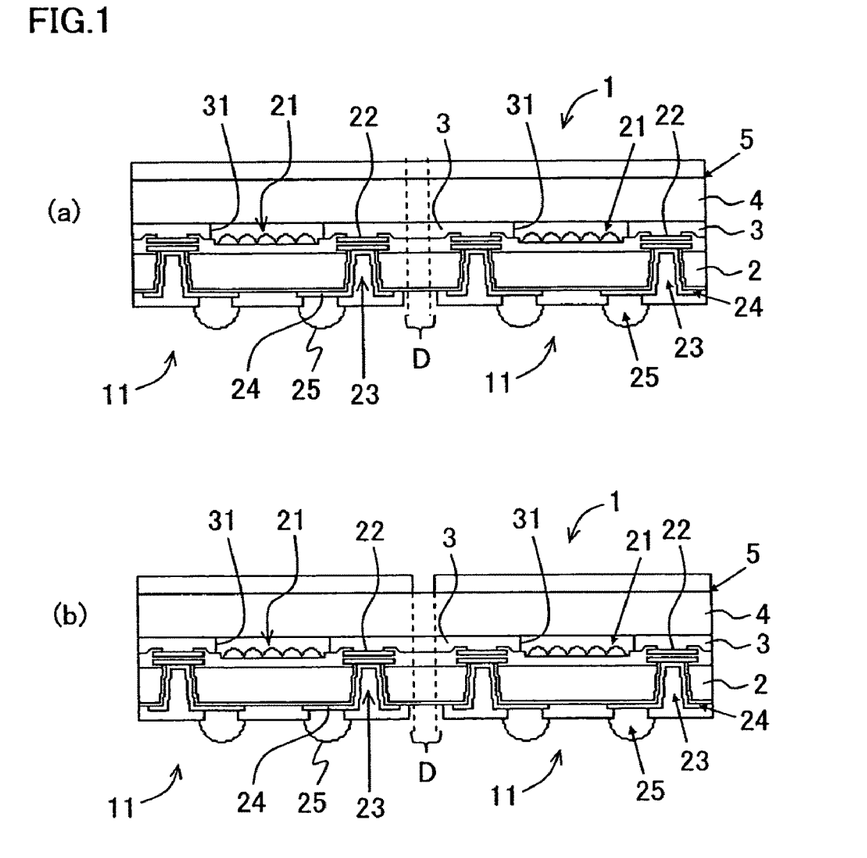
FIG. 1 is an essential part longitudinal cross sectional view illustrating an exemplary structure of an electronic element wafer module according to Embodiment 1 of the present invention, where

FIG. 1 is an essential part longitudinal cross sectional view illustrating an exemplary structure of an electronic element wafer module according to Embodiment 1 of the present invention. FIG. 1(a) is an essential part longitudinal cross sectional view illustrating a case where an optical filter is not removed along a dicing line, and a semiconductor and a glass substrate with opposite warping directions are attached to each other. FIG. 1(b) is an essential part longitudinal cross sectional view illustrating a case where an optical filter is removed along a dicing line. Note that the optical filter can be removed along the dicing line from the condition in FIG. 1(a).

In FIGS. 1(a) and 1(b), an electronic element wafer module 1 according to Embodiment 1 includes: a semiconductor substrate 2 having a plurality of solid-state image capturing element 21 as electronic elements formed thereon; a frame-shaped spacer 3 attached on the semiconductor substrate 2 in such a manner so as to enclose the solid-state image capturing elements 21; a cover glass 4 (glass substrate) as a transparent support substrate attached on top of the spacer 3 to cover and hermetically seal the solid-state image capturing elements 21; and an infrared ray cut filter substrate 5 attached on the cover glass 4 to form an optical filter substrate.

The semiconductor substrate 2 is a silicon semiconductor wafer prior to being divided into a rectangular and chip-shaped pieces, and the plurality of solid-state image capturing elements 21 are formed in a matrix on the semiconductor substrate 2. Each of the solid-state image capturing elements 21 is, for example, arranged in a matrix and includes a large number of light receiving elements (a plurality of light receiving sections) for performing photoelectric conversions on a subject light (incident light); and an electric charge coupled device (CCD; electric charge transfer section) for transferring signal charges accumulated in the light receiving elements in vertical and horizontal directions. An RGB color filters and a light-focusing micro lens are further laminated thereon and provided above the plurality of light receiving elements. Instead of the CCD image sensor, a CMOS image sensor can be used as the solid-state image capturing elements 21. An electrode pad 22 is provided as a wiring section or a terminal section in the periphery of the solid-state image capturing elements 21 which function as an electronic element. The electrode pad 22 is connected to a wiring 24 on the back surface through a through hole 23, and the wiring 24 is connected to an external connection terminal 25. A plurality of external connection terminal 25 are provided on the peripheral portions of the solid-state image capturing elements 21.

The spacer 3 has a frame shape with a square or rectangular opening 31 formed in a middle element area thereof for the solid-state image capturing elements 21, and the spacer 3 is attached on the upper surface of the semiconductor substrate 2 and at the outer circumference portion of the solid-state image capturing elements 21 in such a manner to enclose the middle element area. For example, the spacer 3 is formed of an inorganic material such as silicon. A hermetically sealed space is created by the spacer 3 between the solid-state image capturing elements 21 on the front surface side and the bottom surface of the cover glass 4, thereby preventing the micro-lenses of the solid-state image capturing elements 21 on the front surface from physically interfering with the bottom surface of the cover glass 4.

The cover glass 4 is attached onto the spacer 3 in such a manner to cover the opening 31 of the spacer 3. A low α ray glass, which prevents the penetration of low α rays, is used for the cover glass 4 to prevent each of the light receiving elements (each light receiving section) of the solid-state image capturing elements 21 from being destroyed by α rays.

The infrared ray cut filter substrate 5 is provided to improve the quality of a captured image of the sensor module 2. The infrared ray cut filter substrate 5 cuts infrared rays in a specific wavelength region to prevent ghost and fog due to infrared rays.

Hereinafter, the operation will be described with the structure described above.

Hereinafter, a detailed description will be given, with reference to each of the cross sectional views of the processes in FIGS. 2(a) to 2(f), regarding a method for manufacturing a sensor wafer module as a method for manufacturing the electronic element wafer module 1, and further, a method for manufacturing a sensor module as an electronic element module cut off all together from a sensor wafer module.

FIGS. 2(a) to 2(f) are each an essential part longitudinal cross sectional view illustrating each manufacturing process of a sensor module that is manufactured by cutting off the electronic element wafer module 1 of FIG. 1(b).

Figure 2:
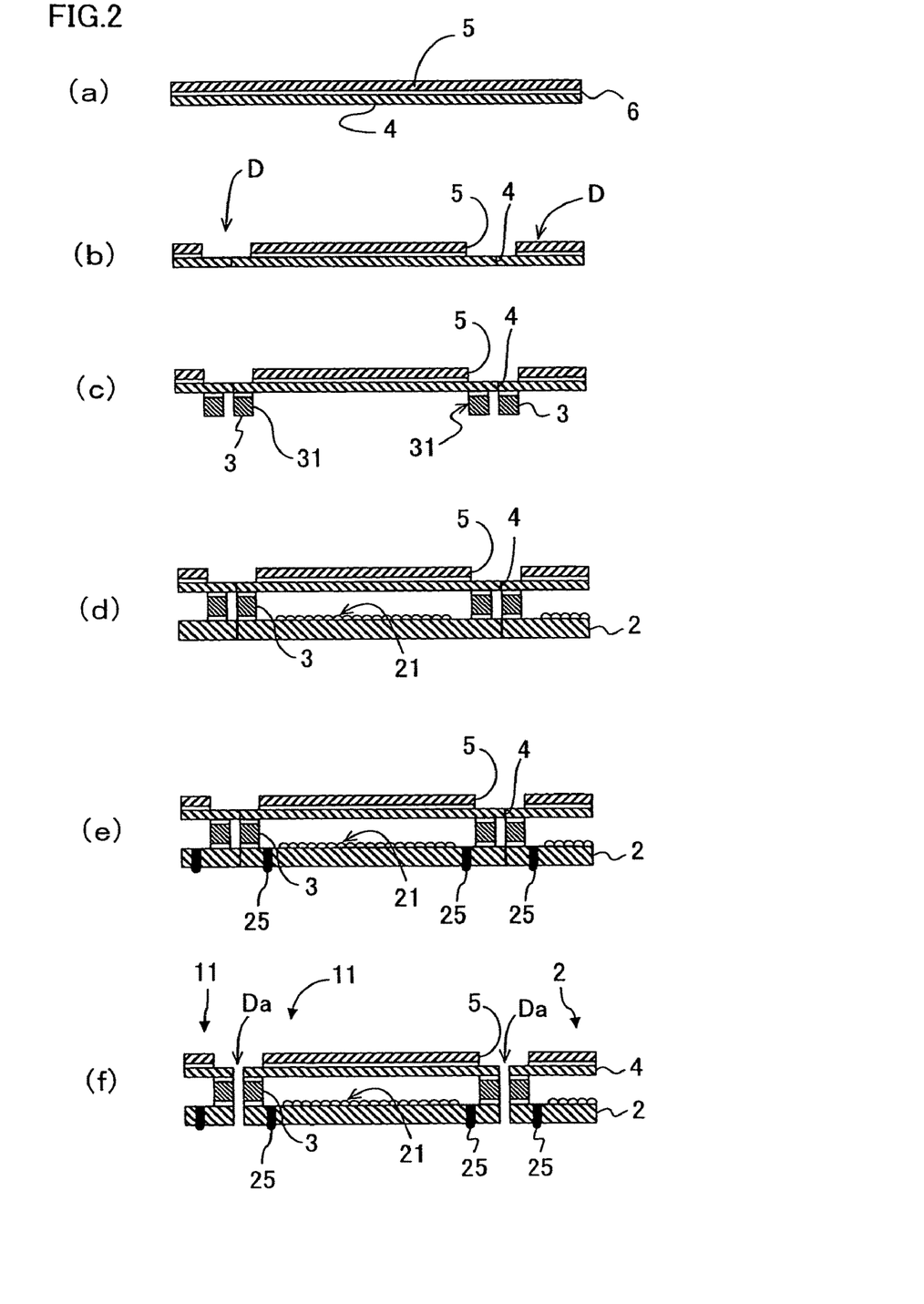
FIGS. 2(a) to 2(f) are each an essential part longitudinal cross sectional view illustrating each manufacturing process of a sensor module which is manufactured by cutting the electronic element wafer module in FIG. 1(b).

First, in a first process, a formation of an optical filter substrate is performed (other forms of the substrate may include being in a sheet form or a film form). The optical filter substrate is attached on a glass substrate that will be a base for the cover glass 4. As illustrated in FIG. 2(a), the formation of the optical filter substrate is such that the infrared ray cut filter substrate 5, which is substantially as large as the glass substrate, is attached by an adhesive 6 on the glass substrate (referred to as the glass substrate 4 with the same reference numeral), which will be the base for the cover glass 4.

For example, an UV adhesive which becomes transparent after solidification is used as the adhesive 6 used to attach the glass substrate 4 and the infrared ray cut filter substrate 5. The adhesive 6 is applied thinly on the glass substrate 4 with an even thickness. Since the attachment of the glass substrate 4 and the infrared ray cut filter substrate 5 is performed such that no air enters in between, the process is performed in a vacuum environment, for example, and the glass substrate 4 and the infrared ray cut filter substrate 5 are closely adhered to each other by vacuum press subsequent to the adhesion. Subsequently, the adhesive 6 is solidified by irradiating ultraviolet rays through the glass substrate 4 onto the adhesive 6, so that the glass substrate 4 and the infrared ray cut filter substrate 5 are firmly adhered to each other.

Figure 3:
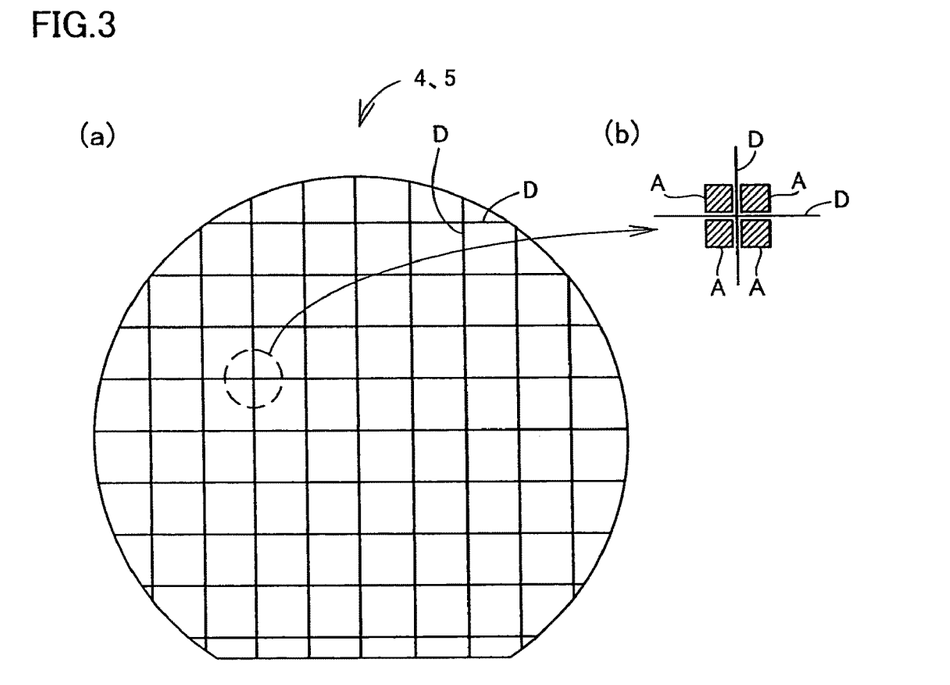
FIG. 3(a) is a plan view of an optical filter indicating lattice-formed dicing lines D.
FIG. 3(b) is a plan view of an optical filter for describing the relationship between the dicing lines D and alignment marks.

Next, in a second process, the optical filter partially removing process, with regard to the optical filter (infrared ray cut filter substrate 5) provided above the glass substrate 4 as illustrated in FIG. 2(b), the optical filter remains to include or cover a solid-state image capturing element area (image capturing area) in the middle portion, which is necessary as a sensor module 11 after the cutting, while the optical filter is removed from a portion corresponding to part or all of dicing lines D (for example, a portion corresponding to part or all of lattice-shaped dicing lines D in FIG. 3). The removing method includes common photolithography and etching processes. In summary, only the infrared ray cut filter substrate 5 may be divided in a lattice form by laser beam or dicing blade, as another removing method.

Subsequently, in the third process, the spacer forming process, a large number of spacers 3 are formed on the bottom surface side of the glass substrate 4 to enclose the solid-state image capturing elements 21, as illustrated in FIG. 2(c). The formation of the spacer 3 is performed in the following steps, as an example. First, a silicon wafer for the spacer is adhered by adhesive on the bottom surface of the glass substrate 4 side. Next, a resist mask of the shape of the spacer 3 (shape having an opening 31 for each middle portion of the chip) is formed by photolithography on the wafer for the spacer. Further, portions which are not covered by the mask are removed by plasma etching, so that a large number of spacers 3 are formed on the glass substrate 4 (the spacers 3 enclosing the solid-state image capturing elements 21 are formed for each group of the solid-state image capturing elements 21). After the etching, the resist mask is removed by ashing and the like.

Subsequently, in the fourth process, the substrate attaching process, the attachment of the glass substrate 4 and the semiconductor substrate 2 is performed as illustrated in FIG. 2(d). The semiconductor substrate 2 is a semiconductor wafer on which a large number of solid-state image capturing elements 21 are formed. An alignment adhering apparatus is used for the attachment. The alignment adhering apparatus performs an alignment of alignment marks A of four horizontal and vertical squares (or rectangles) provided on the semiconductor substrate 2 side as illustrated in FIG. 3(b), with lattice dicing lines D of FIG. 3(a) as a reference while each orientation flat or notch of the glass substrate 4 and the semiconductor substrate 2 as a semiconductor wafer is used as a point of reference as well. In this case, the positional adjustment of the glass substrate 4 and the semiconductor substrate 2 is performed in the X and Y directions and the rotating direction thereof by using infrared ray light (which also makes an adhesive layer visible) and magnifying the dicing lines D through camera to confirm the positions on a display screen such that the cross dicing lines D are positioned between the alignment marks A of four horizontal and vertical squares (or rectangles). Further, the glass substrate 4 and the semiconductor substrate 2 are put on top of another and pressed, so that the glass substrate 4 and the semiconductor substrate 2, which is a semiconductor wafer, are accurately attached with each other. By the attachment of the glass substrate 4 and the semiconductor substrate 2, each of the solid-state image capturing elements 21 on the semiconductor substrate 2 is covered and enclosed by the spacers 3 and the glass substrate 4, and therefore, dust to be created in the latter processes will not attach to the solid-state image capturing elements 21.

Figure 4:
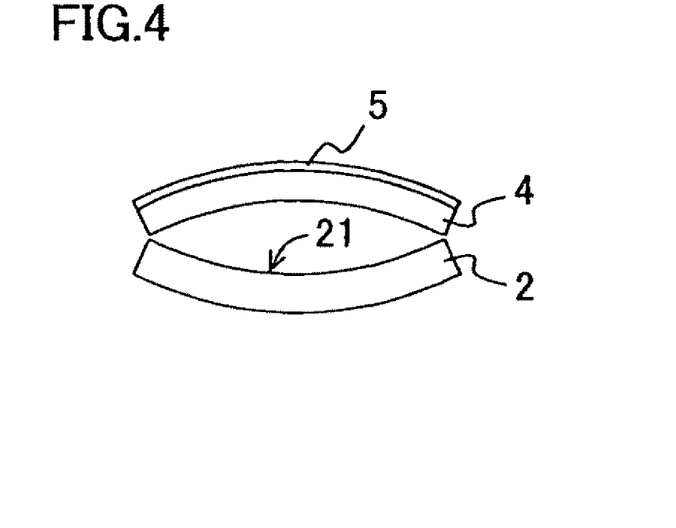
Figure 5:
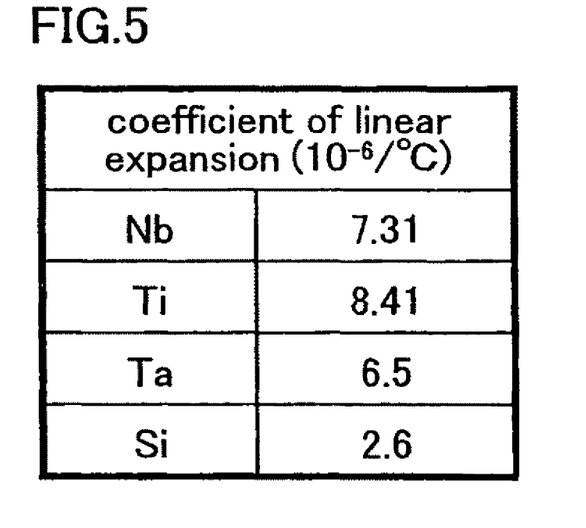
FIG. 5 is a table listing the coefficient of linear expansion of each of materials.

Further, in the fourth process, the substrate attaching process, the glass substrate 4 having the infrared ray cut filter substrate 5 attached thereon convexly warps upwards, and the semiconductor substrate 2 having the large number of solid-state image capturing elements 21 formed thereon convexly warps downwards, as illustrated in FIG. 4. However, when the glass substrate 4 and the semiconductor substrate 2, which warp in opposing directions, are attached to each other, the respective warps of the attached glass substrate 4 and the semiconductor substrate 2 are offset and lessened with each other in the laminated body (the materials are selected based on the difference of the coefficients of linear expansion of the materials). In the same process, the infrared ray cut filter substrate 5 on the glass substrate 4 is divided into sections by the lattice dicing lines D as illustrated in FIG. 3(a). As a result, although the material of the glass substrate 4 is $SiO_2$ and the material of the infrared ray cut filter substrate 5 is niobium oxide (a dielectric multilayered film that is made by alternately laminating silicon oxide films and niobium oxide films), and there is a difference in the coefficients of linear expansion of the materials as illustrated in FIG. 5, the warping of the laminated body constituted by the glass substrate 4 and the infrared ray cut filter substrate 5 is lessened by the fine dividing of the infrared ray cut filter substrate 5 into the lattice form. Therefore, the warping of the laminated body constituted by the glass substrate 4 and the infrared ray cut filter substrate 5 is also lessened.

Herein, the example of lessening the warp of the glass substrate 4 and the infrared ray cut filter substrate 5, and the semiconductor substrate 2 is performed by forming a laminated body of the glass substrate 4 and the infrared ray cut filter substrate 5 and the semiconductor substrate 2, each of which having an opposing warping direction, so that the warp of the glass substrate 4 and the warp of the infrared ray cut filter substrate 5 and the semiconductor substrate 2 are offset by each other, and additionally, by the lattice dicing lines D for lessening the warp of the glass substrate 4 and the infrared ray cut filter substrate 5. However, without the limitation to this, the example may include only one of the lessening of the warping by forming the laminated body with the glass substrate 4 and the infrared ray cut filter substrate 5 and the semiconductor substrate 2 with opposing warping directions, and the lessening of the warping of the laminated body of the glass substrate 4 and the infrared ray cut filter substrate 5 by the lattice dicing lines D, as long as it is possible to lessen the warping of the laminated body of the glass substrate 4 with the infrared ray cut filter substrate 5 and the semiconductor substrate 2.

Further, in the fifth, through hole electrode and external connection terminal forming process, a through hole electrode structure for performing a circuit connection to elements formed through the back surface to the front surface of the semiconductor substrate 2 as well as each of external connection terminals 25 connected thereto are formed, as illustrated in FIG. 2(e). For the formation of the through hole electrode structure and each of the external connection terminals 25 connected thereto, existing photolithography, etching and plating techniques are used. By this process, a sensor wafer module is manufactured as the electronic element wafer module 1 of a laminated structure of the semiconductor substrate 2 functioning as a semiconductor wafer, the glass substrate 4 attached thereon, and the infrared ray cut filter substrate 5 attached on the glass substrate 4.

Subsequently, in the sixth, dicing process, the sensor wafer module, which is the laminated structure of the semiconductor substrate 2 functioning as a semiconductor wafer, the glass substrate 4 attached thereon, and the infrared ray cut filter substrate 5 attached on the glass substrate 4, is diced at a center line Da of the dicing line D with a dicing blade, as illustrated in FIG. 2(f). A dicing tape is adhered on the glass substrate 4 for the protection and the glass substrate 4 and the attached substrate is fixed and set to a dicing apparatus. This dicing apparatus divides the sensor wafer module, which is the laminated structure of the semiconductor substrate 2 functioning as a semiconductor wafer, the glass substrate 4 attached thereon and the infrared ray cut filter substrate 5 attached on the glass substrate 4, at the center line Da of the dicing line D for each of the solid-state image capturing elements 21, using a metal resin grindstone and the like, while pouring cold water onto the substrate. The metal resin grindstone is made by solidifying diamond abrasive grains with resin, for example. As a result, the sensor wafer module as the electronic element wafer module 1 is divided into pieces and each sensor module 11 is manufactured as an individually separated electronic element module.

When the sensor module 11 is manufactured from an eight-inch semiconductor wafer, about 2000 pieces of the sensor modules 11 can be simultaneously manufactured from one sensor wafer module. If each infrared ray cut filter substrate 5 is attached to each of the 2000 sensor modules, enormous number of manufacturing processes and amount of cost would be required. However, by the manufacturing method above, such cost problem can be solved.

However, by attaching the infrared ray cut filter substrate 5 onto the glass substrate 4 with the adhesive 6, and by cutting them together with the semiconductor substrate 2 along the center line Da of the dicing line D in between adjacent spacers 3 into pieces as described in Embodiment 1, in a single process, specifically the fourth process, the substrate attaching process, it is possible to achieve a significant reduction of the number of processes and the cost. Furthermore, by performing an electric connection to the solid-state image capturing elements 21 from the back surface of the substrate, it becomes possible to reduce the area of the sensor module 11.

The complete sensor module 11 is installed on a printed circuit board (substrate having electronic parts attached thereon) together with an optical unit after passing a functional test and the like, and is assembled as a camera module (solid-state image capturing apparatus which will be described later in Embodiment 3).

Furthermore, the camera module is built in a small electronic information device, such as a cell phone device of Embodiment 3 to be described later, as a solid-state image capturing apparatus including a sensor module. In the sensor module 11 according to Embodiment 1, the infrared ray cut filter substrate 5 is formed on the glass substrate 4 functioning as a cover glass, instead of separately providing the infrared ray cut filter substrate 5. As a result, the optical unit can be small, which contributes to the downsizing of the small electronic information device in which the sensor module is built.

In Embodiment 1, the optical filter is removed along a part (lattice form with every other or every third line of the dicing lines) or all (lattice form) of the dicing line D. However, it is also possible to remove the optical filter along shapes, other than the lattice form, such as repetitive forms of two successive edges of square or rectangle as a part of the dicing line D. In addition, in the state where a translucent support substrate is attached to an electronic element wafer, the optical filter may be removed along a part of the dicing line D, which allows the warping of the attached structure (module) to be lessened.

In Embodiment 1, the glass substrate 4 is used as the translucent support substrate (transparent support substrate). However, without the limitation to this, the material of the translucent support substrate may include: crystal, niobium oxide lithium, synthetic resin and/or the combination thereof, other than glass.

Figure 6:
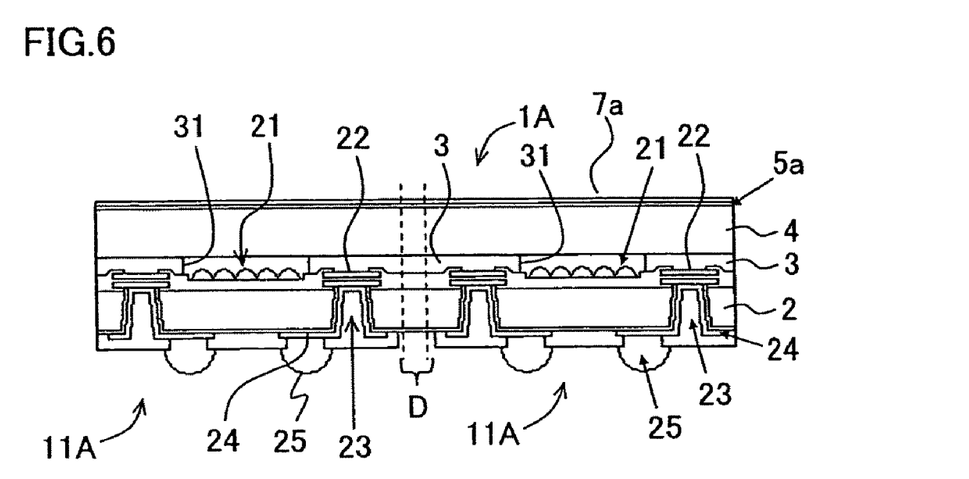
FIG. 6 is an essential part longitudinal cross sectional view illustrating a variation of the electronic element wafer module in FIG. 1.

In Embodiment 1, a dielectric multilayered film is formed by alternately laminating silicon oxide films and niobium oxide films, and such a dielectric multilayered film is used as the infrared ray cut filter substrate 5 (or an infrared ray cut filter layer 5a of FIG. 6 to be described later). However, without the limitation to this, the infrared ray cut filter substrate 5 (or an infrared ray cut filter layer 5a of FIG. 6 to be described later) may be formed by a dielectric multilayered film that is formed by alternately laminating silicon oxide films and titanium oxide films, or a dielectric multilayered film that is formed by alternately laminating silicon oxide films and tantalum oxide films. Note that a film thickness of about 60 layers is necessary for a dielectric multilayered film that is formed by alternately laminating silicon oxide films and titanium oxide films or a dielectric multilayered film that is formed by alternately laminating silicon oxide films and tantalum oxide films in order to have the same infrared ray cutting function, as a dielectric multilayered film that is formed by alternately laminating silicon oxide films and niobium oxide films having a film thickness of about 30 layers. That is, the thickness of the infrared ray cut filter substrate 5 and the infrared ray cut filter layer 5a can be thinner when formed with a dielectric multilayered film of silicon oxide films and niobium oxide films. Furthermore, the warping of the substrate can be lessened with half the stress. Therefore, a dielectric multilayered film of silicon oxide films and niobium oxide films can reduce the warping of the glass substrate 4 having the infrared ray cut filter substrate 5 attached thereon better than a dielectric multilayered film of silicon oxide films and titanium oxide films or a dielectric multilayered film of silicon oxide films and tantalum oxide films. Therefore, when a dielectric multilayered film of silicon oxide films and niobium oxide films is used as the infrared ray cut filter substrate 5 or the infrared ray cut filter layer 5a, the infrared ray cut filter substrate 5 or the infrared ray cut filter layer 5a may or may not be divided into sections by the lattice dicing lines D.

In Embodiment 1, the infrared ray cut filter substrate 5 is attached on the glass substrate 4 to form the optical filter substrate in the electronic element wafer module 1. However, without the limitation to this, as an electronic element wafer module 1A, an infrared ray cut filter layer 5a and an optical low pass filter layer 7a may be formed on the glass substrate 4 functioning as a cover glass in this order by a film forming process, as illustrated in FIG. 6. As a matter of course, as an electronic element wafer module 1A, an infrared ray cut filter substrate 5 and an optical low pass filter substrate 7 may be formed on the glass substrate 4 functioning as a cover glass, in this order by a film forming process as the substrate structure. The optical low pass filter substrate 7 and the optical low pass filter layer 7a function to prevent color noise and false colors.

In Embodiment 1, the infrared ray cut filter substrate 5 is attached on the glass substrate 4 and lattice formed slits are formed in the infrared ray cut filter substrate 5 in the electronic element wafer module 1. However, without the limitation to this, when lattice formed slits are formed on the surface of the glass substrate 4, an infrared ray cut filter layer 5a will not continuously adhere over the lattice formed slits of the glass substrate 4. Consequently, the slits of the glass substrate 4 will have the same effect as the effect of providing lattice formed slits in the infrared ray cut filter substrate 5.

The formation of the optical filter layer (an infrared ray cut filter layer 5a and an optical low pass filter layer 7a) on the glass substrate 4 by filming is performed, similarly as the aforementioned formation by attaching the substrate, by using a CVD apparatus and a vacuum vapor deposition apparatus for the glass substrate 4, which is a base material of a cover glass. Subsequently, similar to the case of Embodiment 1 described above, a forming process of a spacer layer 3 onto the bottom surface of the glass substrate 4; an attaching process of the glass substrate 4 having the spacer layer 3 formed thereon to the semiconductor substrate 2, which is a semiconductor wafer; and a dicing process for each of the solid-state image capturing elements 21 are performed, as illustrated in FIG. 6. As a result, a large number of sensor modules 11A will be cut out and manufactured at once from a sensor wafer module as the electronic element wafer module 1A.

Also in a case where the optical filter layer (an infrared ray cut filter layer 5a and an optical low pass filter layer 7a) is formed by the filming process as described above, the filming process can be completed at the same time for a large number of solid-state image capturing elements 21, making it possible to achieve a significant reduction of the number of processes and the cost compared to a case where the filming process is provided for each of the large number of solid-state image capturing elements 21.

Furthermore, in Embodiment 1, the removal of a part of the optical filter layer is performed before the glass substrate 4 is attached to the semiconductor substrate 2 which is a semiconductor wafer. However, without the limitation to this, the removal of a part of the optical filter layer (lattice formed by dicing line D in FIG. 3(a)) may be performed after the glass substrate 4 is attached to the semiconductor substrate 2. Furthermore, in Embodiment 1, the glass substrate 4 is attached to the semiconductor substrate 2 after the optical filter layer is formed above the glass substrate 4. However, after the glass substrate 4 is attached to the semiconductor substrate 2, the infrared ray cut filter substrate 5 and the optical low pass filter substrate 7 may be attached on the glass substrate 4, or the optical filter layer may be formed by the filming process of the infrared ray cut filter layer 5a and the optical low pass filter layer 7a.

Furthermore, the attaching process and filming process may be combined when a plurality of optical filter substrates and optical filter layer are formed on the glass substrate 4 that covers the solid-state image capturing elements 21.

Figure 7:
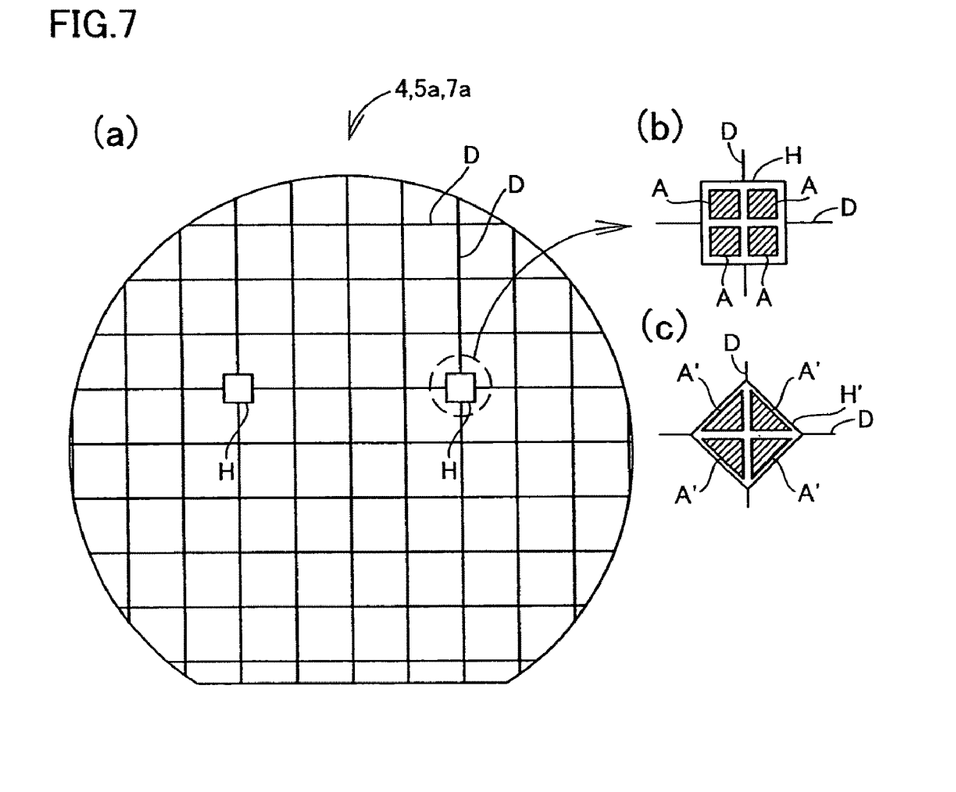
FIG. 7(a) is a plan view of an optical filter illustrating lattice dicing lines D and a removing area H of an optical filter layer.
FIGS. 7(b) and 7(c) are each a plan view of an optical filter for describing the relationship between the dicing lines D and the removing area H of an optical filter layer, and alignment marks.

In the attaching process of the glass substrate 4 and the semiconductor substrate 2 in the fourth process of Embodiment 1, a case is described that, when an alignment is performed for the alignment marks A of four horizontal and vertical squares provided on the semiconductor substrate 2 side as illustrated in FIG. 3(b) (alignment of the semiconductor substrate 2 and the glass substrate 4) with lattice dicing lines D of FIG. 3(a) (portion where a partial area is removed from the optical filter substrate) as a point of reference, the positional adjustment of the glass substrate 4 and the semiconductor substrate 2 is performed in the X and Y directions and the rotating direction thereof while magnifying the image taken by an infrared ray camera on a display screen to confirm the position such that the cross dicing lines D are positioned between the alignment marks A of four horizontal and vertical squares. However, without the limitation to this, the positional adjustment of the glass substrate 4 and the semiconductor substrate 2 may be performed in the X and Y directions and the rotating direction thereof while magnifying the image taken by an infrared ray camera on a display screen to confirm the position such that the outer circumference of the alignment marks A of four horizontal and vertical squares is contained in a removing area H of the optical filter layer and that the edge of the dicing lines D is positioned in between the alignment marks A of four horizontal and vertical squares, when an alignment is performed for the alignment marks A of four horizontal and vertical squares provided on the semiconductor substrate 2 side as illustrated in FIG. 7(b) with the removing area H of the square or rectangular optical filter layer (the infrared ray cut filter layer 5a and the optical low pass filter layer 7a) of FIG. 7(a) and the lattice dicing lines D as references. In another case, the alignment marks may be a form of rhombus having four right-angled triangles with their apexes opposing with one another, as illustrated by alignment marks A' in FIG. 7(c). In this case, a more accurate positional adjustment of the glass substrate 4 and the semiconductor substrate 2 (alignment of the glass substrate 4 and the semiconductor substrate 2) may be performed in the X and Y directions and the rotating direction thereof while magnifying the image taken by a camera on a display section to confirm the position such that the outer circumference of the alignment marks A' of four right-angled triangles is contained in a removing area H' of the optical filter layer and that the edge of the dicing lines D is positioned in between the alignment marks A' of four right-angled triangles, when an alignment is performed for the alignment marks A of four right-angled triangles provided on the semiconductor substrate 2 side as illustrated in FIG. 7(c) with the removing area H' of the rhombic outer form of the optical filter layer in FIG. 7(c) and the edge of the dicing lines D as references.

As a further description of Embodiment 1, a group of microlenses are formed on the image capturing element that is an electronic element, and a vacant space is provided between the group of the microlenses and the glass substrate 4 functioning as a transparent support substrate. The spacer 3 is filled as an insulation adhesive in the peripheral portion of the vacant space that is not covering the image capturing element.

As described above, the infrared ray cut filter substrate 5 functioning as an optical filter is divided into a lattice form along the dicing lines D so as to lessen the stress of the substrate warping; the dielectric multilayered film made by alternately laminating silicon oxide films and niobium oxide films is used, so as to reduce the thickness of the infrared ray cut filter substrate 5 in half, to reduce the stress of the substrate warping in half; and the glass substrate 4 functioning as a transparent support substrate, and the semiconductor substrate 2 functioning as a semiconductor wafer and having an opposite warping direction, are attached with each other so as to offset respective stresses of the warping. By any of the above-described matters or the combination thereof, it becomes possible to further reduce the warping that occurs when the semiconductor substrate 2 is attached with the glass substrate 4 functioning as a transparent support substrate and having the infrared ray cut filter substrate 5 attached thereon.

In the case described above, the electronic element is an image capturing element that includes a plurality of light receiving sections for performing photoelectric conversions and capturing an image of the light from a subject. However, without the limitation to this, the electronic element may be a light emitting element for generating an output light and a light receiving element for receiving an incident light.

As an example of a sensor module according to Embodiment 2 as an electronic element module in which an optical element, such as a lens plate, is further attached on the sensor module 11 or 11A functioning as an electronic element module according to Embodiment 1, an example of a sensor module will be described with reference to FIG. 8. In the sensor module, a semiconductor substrate 2 including an image capturing element (corresponding to the solid-state image capturing element 21) having a plurality of light receiving sections for performing photoelectric conversions and capturing an image of the light from a subject; a glass substrate 4 including an infrared ray cut filter substrate 5 and an optical low pass filter substrate 7 each attached thereon; and one or more lens modules (lens plate having three optical elements in the following Embodiment 2) for forming an image of the incident light onto the image capturing element, are laminated.

(Embodiment 2)

Figure 8:
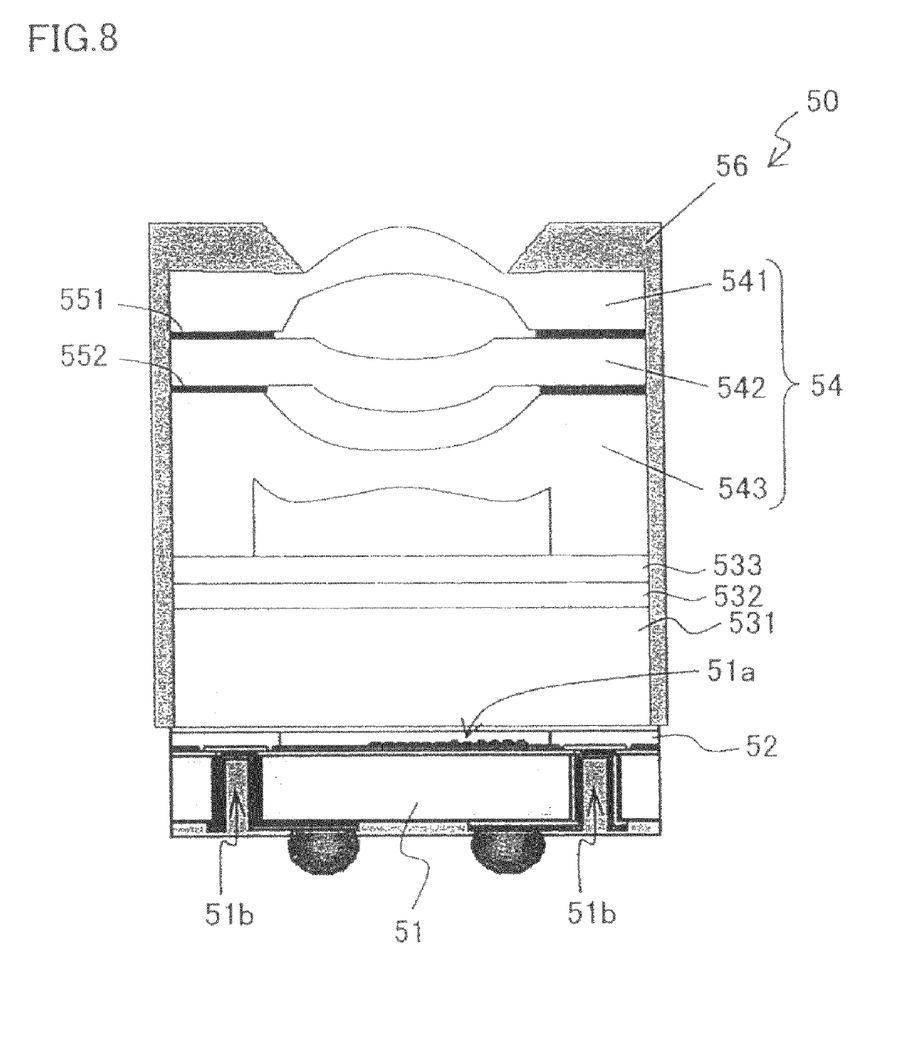
FIG. 8 is a longitudinal cross sectional view illustrating an exemplary essential structure of a sensor module according to Embodiment 2 of the present invention.

FIG. 8 is a longitudinal cross sectional view illustrating an exemplary essential structure of a sensor module according to Embodiment 2 of the present invention.

In FIG. 8, a sensor module 50 according to Embodiment 2 includes: a through hole wafer 51 (corresponding to each chip individually separated from an electronic element wafer module), in which an image capturing element 51a functioning as an electronic element that is constituted of a plurality of light receiving sections, which are photoelectric conversion sections (photodiodes) corresponding to a plurality of respective pixels, is provided on a surface of the chip, and in which a through hole 51b is provided as a through hole electrode between the front surface and the back surface electrically connecting them as wiring; a resin adhesive layer 52 (corresponding to the spacer 3 in FIG. 3) formed in the periphery of the image capturing element 51a of the through hole wafer 51; a glass plate 531 (corresponding to the glass substrate 4 as a transparent support substrate in FIG. 1) individually separated as a cover glass covering the resin adhesive layer 52 and having an infrared ray cut filter substrate 532 (corresponding to the infrared ray cut filter substrate 5 in FIG. 1) and an optical low pass filter substrate 533 (corresponding to the optical low pass filter substrate 7, specifically the optical low pass filter layer 7a in FIG. 6) attached on a surface thereof; a lens plate 54 (lens module) provided above the laminated structure of the glass plate 531, infrared ray cut filter substrate 532 and optical low pass filter substrate 533 and in which a plurality of lens plates 541 to 543 functioning as an optical element for focusing an incident light on the image capturing element 51a; lens adhesive layers 551 and 552 for adhering and fixing the lens plates 541 to 543; and a light shielding member 56 for providing an opening at the middle portion of the upper most lens plate 541 among the lens plates 541 to 543 as a circular light in-take and for shielding the rest of surface portions and side surface portions of each of the lens plates 541 to 543 and the glass plate 531. Furthermore, above the through hole wafer 51, the glass plate 531 and the lens plate 54 are adhered vertically in this order with alignment, by resin adhesive layer 52 and the lens adhesive layers 551 and 552.

In summary, the sensor module 50 according to Embodiment 2 as an electronic element module, is formed such that the plurality of lens plates 541 to 543 are adhered by the adhesive layers 551 and 552 on the electronic element wafer module 1 or 1A according to Embodiment 1, and using this wafer module as a new electronic element wafer module, the wafer module is individually divided into pieces, and the light shielding member 56 is attached on top. As a result, the sensor module 50 according to Embodiment 2 is manufactured.

The lens plate 54 is a lens plate of transparent resin or transparent glass. The lens plate 54 is formed with a lens area having a lens function; and a peripheral flange as a spacer section that has a spacer function. The entire lens plate configuration is formed with a same type of glass or resin material. With the structure described above, it is possible to form the lens plates 541 to 543 having a predetermined lens thickness.

In Embodiment 2, the lens plate 54 has a structure where three of the formed lens plates 541 to 543 are laminated at the lens flanges. The adhesive members 551 and 552 are used for the lamination, and the adhesive members 551 and 552 may have a light shielding function.

The lens plate 54 of a plurality of lenses as an optical element includes an aberration correcting lens 543, a diffusion lens 542, and a light focusing lens 541 (for a case with only one lens, the lens is a light focusing lens). In the lens plate 54, a lens area is provided at the middle portion and a lens flange is provided in the outer circumference side of the lens area, the lens flange having a predetermined thickness and functioning as a spacer section. Such lenses, or spacer sections, are provided on the outer circumference side of the lens plate 54, with a predetermined thickness. Each of the spacer sections is positioned from the bottom in this order. The spacer sections have a position determining function, and the position determining function is comprised of tapered convex and concave sections or alignment marks A and A'. The adhesive layers 551 and/or 552, which adhere the three lens plates 541 to 543, may also have a light shielding function, and the adhesive layers 551 and 552 may include a solid matter for determining a space.

Next, with a finished product using the sensor module 50 as the electronic element module as Embodiment 3, an electronic information device including the sensor module 11 or 11A according to Embodiment 1 or the sensor module 50 according to Embodiment 2 used in an image capturing section will be described in detail with reference to the accompanying figure.

(Embodiment 3)

Figure 9:
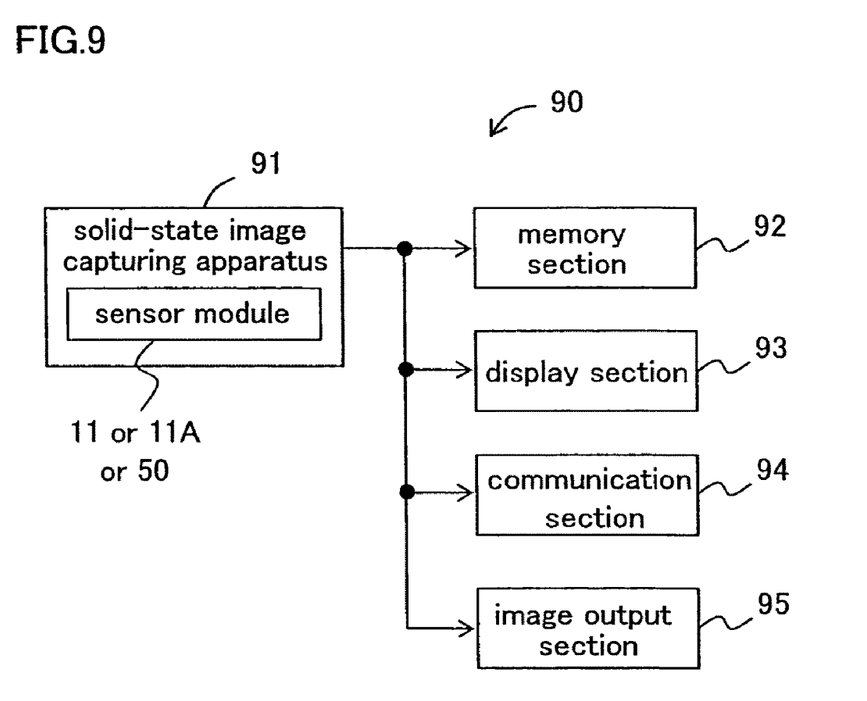
FIG. 9 is a block diagram illustrating an exemplary diagrammatic structure of an electronic information device of Embodiment 3 of the present invention, including any of the sensor modules according to Embodiment 1 or the sensor module according to Embodiment 2 of the present invention used in an image capturing section.

FIG. 9 is a block diagram illustrating an exemplary diagrammatic structure of an electronic information device of Embodiment 3 of the present invention, including the sensor module 11 or 11A according to Embodiment 1 or the sensor module 50 according to Embodiment 2 of the present invention used in an image capturing section.

In FIG. 9, an electronic information device 90 according to Embodiment 3 of the present invention includes: a solid-state image capturing apparatus 91 for performing various signal processing on an image capturing signal from the sensor module 11 or 11A according to Embodiment 1 or the sensor module 50 according to Embodiment 2 so as to obtain a color image signal; a memory section 92 (e.g., recording media) for data-recording a color image signal from the solid-state image capturing apparatus 91 after a predetermined signal processing is performed on the color image signal for recording; a display section 93 (e.g., a liquid crystal display apparatus) for displaying the color image signal from the solid-state image capturing apparatus 91 on a display screen (e.g., liquid crystal display screen) after predetermined signal processing is performed on the color image signal for display; a communication section 94 (e.g., a transmitting and receiving device) for communicating the color image signal from the solid-state image capturing apparatus 91 after predetermined signal processing is performed on the color image signal for communication; and an image output section 95 (e.g., a printer) for printing the color image signal from the solid-state image capturing apparatus 91 after predetermined signal processing is performed for printing. Without any limitations to this, the electronic information device 90 may include, in addition to the solid-state image capturing apparatus 91, any of the memory section 92, the display section 93, the communication section 94, and the image output section 95.

An electronic information device that includes an image input device is conceivable as the electronic information device 90, such as a digital camera (e.g., digital video camera and digital still camera), an image input camera (e.g., a monitoring camera, a door phone camera, a camera equipped in a vehicle such as a back view monitoring camera equipped in a vehicle, and a television camera), a scanner, a facsimile machine, a television telephone device, a camera-equipped cell phone device, and a personal digital assistant (PDA).

Therefore, according to Embodiment 3 of the present invention, the color image signal from the solid-state image capturing apparatus 91 can be: displayed on a display screen finely, printed out on a sheet of paper using an image output section 95, communicated finely as communication data via a wire or a radio, stored finely at the memory section 92 by performing predetermined data compression processing; and various data processes can be finely performed.

Without the limitation to the electronic information device 90 according to Embodiment 3 described above, the electronic information device may be a pick up apparatus having the electronic element module according to the present invention used in an information recording and reproducing section. The optical element of the pick up apparatus in this case is an optical function element (wafer-state optical apparatus: e.g., prism module and a hologram element module, or namely, a hologram optical element and a prism optical element) for advancing an output light straight to be outputted and for refracting an incident light to allow it to enter in a predetermined direction. In addition, the electronic element of the pick up apparatus includes a light emitting element for generating an output light (e.g., semiconductor laser element or a laser chip) and a light receiving element for receiving an incident light (e.g., photo IC).

As described above, the present invention is exemplified by the use of its preferred Embodiments 1 to 3. However, the present invention should not be interpreted solely based on Embodiments 1 to 3 described above. It is understood that the scope of the present invention should be interpreted solely based on the claims. It is also understood that those skilled in the art can implement equivalent scope of technology, based on the description of the present invention and common knowledge from the description of the detailed preferred Embodiments 1 to 3 of the present invention. Furthermore, it is understood that any patent, any patent application and any references cited in the present specification should be incorporated by reference in the present specification in the same manner as the contents are specifically described therein.

Industrial Applicability

The present invention can be applied in the field of an electronic element wafer module in which an optical filter layer is provided on a cover glass which protects a plurality of electronic elements; a method for manufacturing the electronic element wafer module; an electronic element module formed by cutting the electronic element wafer module into pieces; an electronic element module in which an optical element is further attached thereon; and an electronic information device, such as a digital camera (e.g., a digital video camera and a digital still camera), an image input camera, a scanner, a facsimile machine, and a camera-equipped cell phone device, having any of the electronic element modules as an image input device used in an image capturing section thereof. According to the present invention, the optical filter is divided into sections along dicing lines to lessen the stress of the warping, the thickness of the optical filter is reduced in half by using a dielectric multilayered film, which is formed by alternately laminating silicon oxide films and niobium oxide films, to lessen the stress of the warping, and the translucent support substrate is attached to the semiconductor wafer having a warping direction opposite from that of the translucent support substrate to offset the respective stresses. As a result, it becomes possible to further reduce the warping that occurs when an electronic element wafer is laminated with a translucent support substrate having an optical filter such as an infrared ray cut filter attached thereon.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An electronic element wafer module, in which a translucent support substrate for covering and protecting a plurality of electronic elements is attached on an electronic element wafer having the plurality of electronic elements formed thereon, and an optical filter is formed corresponding to the electronic elements on at least one surface of the translucent support substrate, wherein the optical filter is an infrared ray cut filter comprising of a dielectric multilayered film made by alternately laminating silicon oxide films and niobium oxide films, and wherein the translucent support substrate having the optical filter formed thereon and the electronic element wafer are attached together to form a laminated body in such a manner that a warping direction of the electronic element wafer and a warping direction of the translucent support substrate are in opposite directions to each other to reduce the warping of the electronic element wafer.

2. An electronic element wafer module, in which a translucent support substrate for covering and protecting a plurality of electronic elements is attached on an electronic element wafer having the plurality of electronic elements formed thereon, and an optical filter is formed corresponding to the electronic elements on at least one surface of the translucent support substrate, wherein the translucent support substrate having the optical filter formed thereon and the electronic element wafer are attached together to form a laminated body in such a manner that a warping direction of the electronic element wafer and a warping direction of the translucent support substrate are in opposite directions to each other to reduce the warping of the electronic element wafer.

3. An electronic element wafer module according to claim 2, wherein the optical filter is an infrared ray cut filter comprising of a dielectric multilayered film that is made by alternately laminating silicon oxide films and niobium oxide films.

4. An electronic element wafer module according to claim 1, wherein the optical filter is removed along a part or all of dicing lines for individual divisions of a plurality of electronic element modules.

5. An electronic element wafer module according to claim 2, wherein the optical filter is removed along a part or all of dicing lines for individual divisions of a plurality of electronic element modules.

6. An electronic element wafer module according to claim 1, wherein an optical low pass filter is formed as the optical filter.

7. An electronic element wafer module according to claim 2, wherein an optical low pass filter is formed as the optical filter.

8. An electronic element wafer module according to claim 1, wherein the optical filter is formed in at least any of a plate form, a sheet form, a film form, and a layered form.

9. An electronic element wafer module according to claim 2, wherein the optical filter is formed in at least any of a plate form, a sheet form, a film form, and a layered form.

10. An electronic element wafer module according to claim 1 wherein the translucent support substrate is configured of glass, crystal, niobium oxide lithium, synthetic resin and/or the combination thereof.

11. An electronic element wafer module according to claim 2 wherein the translucent support substrate is configured of glass, crystal, niobium oxide lithium, synthetic resin and/or the combination thereof.

12. An electronic element wafer module according to claim 2, wherein the optical filter is an infrared ray cut filter comprising of a dielectric multilayered film that is made by alternately laminating silicon oxide films and titanium oxide films.

13. An electronic element wafer module according to claim 2, wherein the optical filter is an infrared ray cut filter comprising of a dielectric multilayered film that is made by alternately laminating silicon oxide films and tantalum oxide films.

14. An electronic element wafer module according to claim 1, wherein, in the electronic element wafer, a wiring section or pad section provided on a front surface for each electronic element is electrically connected to an external connection terminal on a back surface via a through hole electrode.

15. An electronic element wafer module according to claim 2, wherein, in the electronic element wafer, a wiring section or pad section provided on a front surface for each electronic element is electrically connected to an external connection terminal on a back surface via a through hole electrode.

16. An electronic element module individually divided from the electronic element wafer module according to claim 1, by cutting of the semiconductor wafer and the translucent support substrate having the optical filter formed thereon for each of the electronic elements along a center line of dicing lines.

17. An electronic element module individually divided from the electronic element wafer module according to claim 2, by cutting of the semiconductor wafer and the translucent support substrate having the optical filter formed thereon for each of the electronic elements along a center line of dicing lines.

18. An electronic element module, comprising the electronic element module according to claim 16, and an optical system positioned above an electronic element of the electronic element module, or an optical unit having the optical system embedded therein.

19. An electronic element module, comprising the electronic element module according to claim 17, and an optical system positioned above an electronic element of the electronic element module, or an optical unit having the optical system embedded therein.

20. An electronic element module according to claim 16, wherein the electronic element is an image capturing element that includes a plurality of light receiving sections for performing photoelectric conversions and capturing an image of an image of light from a subject.

21. An electronic element module according to claim 17, wherein the electronic element is an image capturing element that includes a plurality of light receiving sections for performing photoelectric conversions and capturing an image of an image of light from a subject.

22. An electronic element module according to claim 16, wherein the electronic element includes a light emitting element for generating an output light and a light receiving element for receiving an incident light.

23. An electronic element module according to claim 17, wherein the electronic element includes a light emitting element for generating an output light and a light receiving element for receiving an incident light.

24. An electronic element module according to claim 18, wherein the optical system is a lens module and the electronic element is an image capturing element.

25. An electronic element module according to claim 19, wherein the optical system is a lens module and the electronic element is an image capturing element.

26. An electronic element module according to claim 18, wherein the optical system is either a prism module or a hologram element module, and the electronic element is a light emitting element and a light receiving element.

27. An electronic element module according to claim 19, wherein the optical system is either a prism module or a hologram element module, and the electronic element is a light emitting element and a light receiving element.

28. An electronic information device including the electronic element module according to claim 20 as a sensor module in an image capturing section thereof.

29. An electronic information device including the electronic element module according to claim 21 as a sensor module in an image capturing section thereof.

30. An electronic information device including the electronic element module according to claim 22 in an information recording and reproducing section thereof.

31. An electronic information device including the electronic element module according to claim 23 in an information recording and reproducing section thereof.

* * * * *